(12) United States Patent
Fan et al.

(10) Patent No.: US 6,381,164 B1
(45) Date of Patent: Apr. 30, 2002

(54) LOW PROFILE, HIGH DENSITY MEMORY SYSTEM (75) Inventors: Zhineng Fan, Santa Clara; Ai D. Le, Sunnyvale, both of CA (US); Che-Yu Li, Ithaca, NY (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 09/835,123

(22) Filed: Apr. 13, 2001

Related U.S. Application Data (60) Provisional application No. 60/227,689, filed on Aug. 24, 2000.

(51) Int. Cl.[7] .................................................. G11C 5/02
(52) U.S. Cl. ........................... 365/51; 365/63; 361/790; 361/769
(58) Field of Search .................................. 365/149, 182, 365/51, 54, 63; 257/621; 361/769, 790; 439/74

(56) References Cited

U.S. PATENT DOCUMENTS

| | | | | |
|---|---|---|---|---|
| 3,118,133 A | * | 1/1964 | Meeker et al. ............... | 365/149 |
| 5,331,591 A | * | 7/1994 | Clifton ....................... | 365/182 |
| 5,940,728 A | * | 8/1999 | Schumacher ................. | 361/769 |
| 5,963,464 A | | 10/1999 | Dell et al. .................... | 365/52 |
| 6,049,467 A | * | 4/2000 | Tamarkin et al. ............ | 361/790 |
| 6,109,929 A | * | 8/2000 | Jasper ......................... | 439/74 |
| 6,300,670 B1 | * | 10/2001 | Kramer et al. .............. | 257/621 |

* cited by examiner

Primary Examiner—Vu A. Le
(74) Attorney, Agent, or Firm—Salzman & Levy (57) ABSTRACT

The present invention provides a low profile, high density electronic package for high speed, high performance semiconductors, such as memory devices. It includes a plurality of modules having high speed, impedance-controlled transmission line buses, short interconnections between modules and, optionally, driver line terminators built into one of the modules, for maintaining high electrical performance. Suitable applications include microprocessor data buses and memory buses such as RAMBUS and DDR. The modules may be formed on conventional printed circuit cards with unpacked or packed memory chips attached directly to the memory module. Thermal control structures may be included to maintain the high density modules within a reliable range of operating temperatures.

54 Claims, 9 Drawing Sheets

Figure 1a

PRIOR ART

LOW PROFILE, HIGH DENSITY MEMORY SYSTEM

RELATED PATENT APPLICATIONS

This application is related to U.S. Pat. No. 6,172,895, issued to Brown et al. for HIGH CAPACITY MEMORY MODULE WITH BUILT-IN HIGH SPEED BUS TERMINATIONS; U.S. Pat. No. 6,264,476, issued to Li et al. for WIRE SEGMENT BASED INTERPOSER FOR HIGH FREQUENCY ELECTRICAL CONNECTION, which is based on application Ser. No. 09/457,776, filed Dec. 9, 1999; U.S. Pat. No. 6,312,266, issued to Fan et al. for CARRIER FOR LAND GRID ARRAY CONNECTORS, which is based on application Ser. No. 09/645,860, filed Aug. 24, 2000; and copending U.S. patent application, Ser. No. 09/461,065, filed Dec. 14, 1999; copending U.S. patent applications Ser. Nos. 09/645,859, and 09/645,858, both filed Aug. 24, 2000; copending U.S. patent application, Ser. No. 09/866,434, filed May 29, 2001, which is a nonprovisional application based on provisional application Ser. No. 60/227,689, filed Aug. 24, 2000; and copending U.S. patent application Ser. No. 09/772,641, filed Jan. 31, 2001, all of which are hereby incorporated by reference.

FIELD OF THE INVENTION

The present invention relates to high density, low profile electronic packages and, more particularly, to the high density, low profile packaging of high performance, high density memory modules having impedance-controlled transmission line buses and, optionally, driver line terminators built into the modules, for maintaining high electrical performance.

BACKGROUND OF THE INVENTION

The current trend in electronic package design for use in high speed electronic systems is to provide high electrical performance, high density and highly reliable interconnections between various circuit devices, which form important parts of those systems. The system may be a computer, a telecommunications network device, a handheld "personal digital assistant", medical equipment, or any other electronic equipment.

High reliability for such connections is essential due to potential end product failure, should vital misconnections of these devices occur. It is also very important that the interconnections be as dense as possible, use the least possible amount of real estate on the printed circuit board, and provide minimal impact on the printed circuit board wiring. In some cases, such as for laptop computers and handheld devices, it is very important that the height of the connectors and the auxiliary circuit members be as low as possible.

As system density and performance have increased so dramatically, so have the stringent specifications for interconnections. One way high electrical performance is manifested is in improved signal integrity. This can be accomplished by providing the interconnections with shielding that helps them to more closely match a desired system impedance. These demanding requirements, especially when coupled with the requirement for field-separability, have led to a wide variety of possible connector solutions.

Also, to assure effective repair, upgrade, and/or replacement of various components of the system (e.g., connectors, cards, chips, boards, modules, etc.), it is desirable that the connections be reworkable at the factory. It is also highly desirable in some cases that, within the final product, such connections be separable and reconnectable in the field. Such a capability is also desirable during manufacture in order to facilitate testing, for example.

A land grid array (LGA) is an example of such a connection in which each of two primarily parallel circuit elements to be connected has a plurality of contact points, arranged in a linear or two-dimensional array. An array of interconnection elements, known as an interposer, is placed between the two arrays to be connected, and provides the electrical connection between the contact points or pads. For even higher density interconnections, additional parallel circuit elements may be stacked and electrically connected through additional LGA connectors to create three-dimensional packages. In any case, since a retentive force is not inherent as in a pin-and-socket type interconnection, a clamping mechanism is needed to create the force necessary to ensure each contact member is compressed an appropriate amount during engagement to form the required interconnections to the circuit elements. While LGA interposers are implemented in many different ways, the implementations of most interest are those described in the aforementioned copending U.S. patent applications.

For applications such as high-speed memory buses for use in modern, high-speed digital computers, the sophisticated software running on them requires large amounts of volatile random access memory (RAM) at ever-increasing bus and clock speeds. To ensure fast memory cycle times, extremely short, fast rise pulses are used. The electrical drive requirements for servicing the large number of memory devices has become much more stringent than when slower memory was in use.

The maximum operating speed of a memory system is largely determined by the electrical interconnections between the memory controller and the memory devices, or the bus. As data rate increases, signal propagation times through the interconnections are no longer negligible compared to the transition time of the signals. At high bus speeds, these interconnections behave as transmission line networks. The response characteristics of such transmission line networks, therefore, determine the maximum usable speed of the memory bus.

In the current generation of low profile memory packaging technology, the amount of memory physically available on a system is determined by the capacity of the memory devices (chips) themselves and the number of physical electrical connections on individual cards or modules, and the amount of space available to support additional memory cards. The capacity of the line drivers or receivers is another limiter to the number of cards or modules which may be daisy chained.

In conventional random access memory systems, because only one bit can exist on the bus during a certain time interval, the bus speed is determined mainly by the signal setup time of the bus. As a result, the highest achievable data rate for such buses in PC memory systems at present is 266 Mbits per second. Usually, no impedance-matching termination is required or provided in such a conventional RAM system.

At first viewing some of the elements of U.S. Pat. No. 5,963,464, issued to Dell et al. for STACKABLE MEMORY CARD, appear similar to those of various embodiments of the present invention. However, further study shows significant differences. The embodiment depicted in FIGS. 1–3 of DELL is a stackable memory card design. The embodiment depicts a stackable memory. card with connector sockets attached to the top surface and connector pins attached to the bottom surface of each card. Mating sockets are included on the motherboard. While this packaging technology might work adequately with slower memory bus technology, the unshielded inductive connector pins represent enough of an electrical discontinuity to generate significant reflections and electrical noise. Furthermore, the unused sockets on the top surface of the topmost card act as antennae for stray RF pickup. From a reliability/manufacturing point of view, the pin-and-socket approach leaves open the possibility of module damage even if only one pin or socket is bent or otherwise damaged. In such cases, the card must be either reworked or scrapped.

While a RAMBUS®-based memory module has been chosen for purposes of disclosure, it should be obvious that the principles taught by the instant invention can be applied not only to other high speed memory modules, such as Double Data Rate (DDR) SDRAM, but also to a wide variety of electronic packaging structures for many other applications requiring high speed and high performance including but not limited to microprocessor-based, digital signal processor-based, and telecommunications-based applications and subsystems.

To achieve even higher bus speeds and, at the same time, allow for larger memory capacities, impedance controlled types of buses must be adopted. For example, RAMBUS technology, created by Rambus Inc. of Mountain View, Calif. features a memory configuration wherein memory devices are disposed (packaged) on up to three RAMBUS Inline Memory Module (RIMM) cards all interconnected on a motherboard by a high-speed data bus. One or more termination components are placed on the motherboard at the physical end of the bus.

In operation, address/data lines leave driver circuits on the motherboard and enter a first RIMM card in the memory chain. These same address/data lines must leave the RIMM via a complete, second set of connections. This routing continues through a second and sometimes a third RIMM module before the driver lines reach their terminations. This memory/bus configuration allows very fast transit signals to be transmitted between a memory controller and a data storing device over relatively long buses. These buses allow multiple bits to propagate simultaneously down each line of the bus, thereby achieving access data rates of 800 Mbits per second. Even higher bus rates appear feasible in the future.

One most important feature of such bus is that the effective impedance of the signal propagation paths is well controlled, and one end of the bus is terminated to the characteristic impedance of the bus in order to maintain signal fidelity and signal integrity.

In systems adopting such buses, the amplitudes of the driving signals are generally much smaller than amplitudes of conventional digital signals. This is due to the limitation on the driving strength (dv/dt) of the devices.

All of the above mentioned factors make reliable operation very dependent upon controlling the impedance of the interconnections along the bus. Any impedance mismatches along the signal transmission path result in signal degradation which, in turn, may lead to errors in data transmission. At the same time, maintenance of accurate timing among all of the signal bits and clocks is also extremely critical to reliable data transmission. For this reason, minimizing signal-to-clock delay difference (data-to-clock skew) is another important requirement for such buses. Some of the factors that contribute to skew are:

a) differences in conductor lengths,
b) deviations from the nominal impedance of the printed circuit boards and/or substrates printed circuit traces,
c) the number of times that a signal must pass through a connector,
d) the unshielded length of a connector.

The latter is so important because the impedance mismatch of the connector causes reflections, forward crosstalk and reverse crosstalk, all of which act as standing waves that contribute to timing jitter, making skew minimization more difficult.

Prior art low profile memory system designs generally consist of a memory controller, a clock driver and bus terminations all mounted on the motherboard with up to three memory slots between the controller and the termination. The data signals must pass through every module and also through a total of up to six edge connectors before they reach the termination. Because of their design, current edge connectors introduce impedance mismatches and crosstalk that degrade signal quality and therefore limit the performance of the signal channels.

The inclusion of the terminations on a memory module itself provides several types of performance improvement. Because only a single set of connector pins need be used (i.e., there is no need to have the bus lines exit the terminated module), the additional connector pin capacity may be devoted to addressing capability for even greater amounts of memory on a single card or module. This allows two channels of memory to be integrated into the memory package, which yields increased bandwidth and double the memory capacity. Also, by eliminating essentially half of the required connector pins, the saved real estate allows an even greater number of chips to be packaged on a module.

Total bus path length is significantly reduced because more memory may be placed on a single card physically much closer to the driver circuits than has heretofore been possible. Even more improvement is obtained because the extra passage of signals through exit contacts is eliminated. Also eliminated is that portion of the bus path between the memory modules and the external terminator resistors of the prior art.

When all memory modules must be identical (e.g., all without terminations), it is possible to create a separate module for only the terminations. This case is shown in a later embodiment herein. For either this case or the previously disclosed on-module termination one, the present inventive designs may reduce the design complexity and manufacturing cost of both the memory modules and the motherboard. For memory systems having one to three memory modules, using a terminated module or termination module as the last module helps to achieve maximum system performance.

When the inventive, low profile, optionally self-terminating memory modules are combined with innovative land grid array interconnection technology, densities are achieved that are much higher than have been possible heretofore. This allows far more memory to be packaged in a height-constrained application. More memory capacity may be deployed closer to the line drivers/receivers, thereby reducing path lengths, especially when a memory module is self-terminated. Thermal management structures may be included to reduce temperatures and therefore increase reliability.

It is therefore an object of the invention to provide a low profile, high density memory package.

It is an additional object of the invention to provide a low profile, high density memory package utilizing a novel high density connector technology.

It is another object of the invention to provide a low profile, high density memory module with bus terminations optionally provided on the memory module itself.

It is a still further object of the invention to provide a low profile, high density memory package which can operatively reduce data path lengths, thereby helping ease driver electrical requirements in a high speed digital computer or the like.

It is yet another object of the invention to provide a low profile, high density memory package that supports both single and dual bus channels.

SUMMARY OF THE INVENTION

The present invention provides a low profile, high density electronic package for high speed, high performance semiconductors, such as memory devices. It includes a plurality of modules having high speed, impedance-controlled transmission line buses, short interconnections between modules and, optionally, driver line terminators built into one of the modules, for maintaining high electrical performance. Suitable applications include but are not limited to microprocessor data buses and memory buses such as RAMBUS and DDR. The modules may be formed on conventional printed circuit cards with unpacked or packed memory chips attached directly to the memory module. Using memory modules with bus terminations mounted directly on the module improves the signal quality and integrity and therefore enhances the performance of the systems. Such designs may also eliminate the need for bus exit connections, thereby allowing the freed-up connection capacity to be used to address additional memory capacity on the module. Thermal control structure may be included to maintain the high density modules within a reliable range of operating temperatures.

BRIEF DESCRIPTION OF THE DRAWINGS

A complete understanding of the present invention may be obtained by reference to the accompanying drawings, when taken in conjunction with the detailed description thereof and in which:

FIG. 1b is a cross sectional, enlarged view of a vertical plated-through-hole attach connector and memory card of the prior art shown in FIG. 1a;

FIG. 1c is a cross sectional, enlarged view of a low profile connector and memory card of the prior art shown in FIG. 1a;

FIG. 2b is a cross sectional, enlarged view, of the low profile memory package of the invention as shown in FIG. 2a;

FIG. 3b is a cross sectional, enlarged view of the low profile memory package of the invention as shown in FIG. 3a;

FIG. 4b is a cross sectional, enlarged view of the low profile memory package of the invention as shown in FIG. 4a;

FIG. 5b shows a technique for enhancing electrical performance that is inherent in the disclosed embodiments of the invention compared to the prior art shown in FIG. 5a.

DETAILED DESCRIPTION OF THE PREFERRED EMBODIMENT

Generally speaking, the present invention is a low profile, high density electronic package for high speed, high performance semiconductors, such as memory devices made either from bare memory chips or conventional memory chip packages. It includes a plurality of modules having high speed, impedance-controlled transmission line buses, short LGA interconnections between modules and a motherboard and, optionally, driver line terminators built into one of the modules, for maintaining high electrical performance. Thermal control structures may be included to maintain the high density modules within a reliable range of operating temperatures.

Figure 1A:
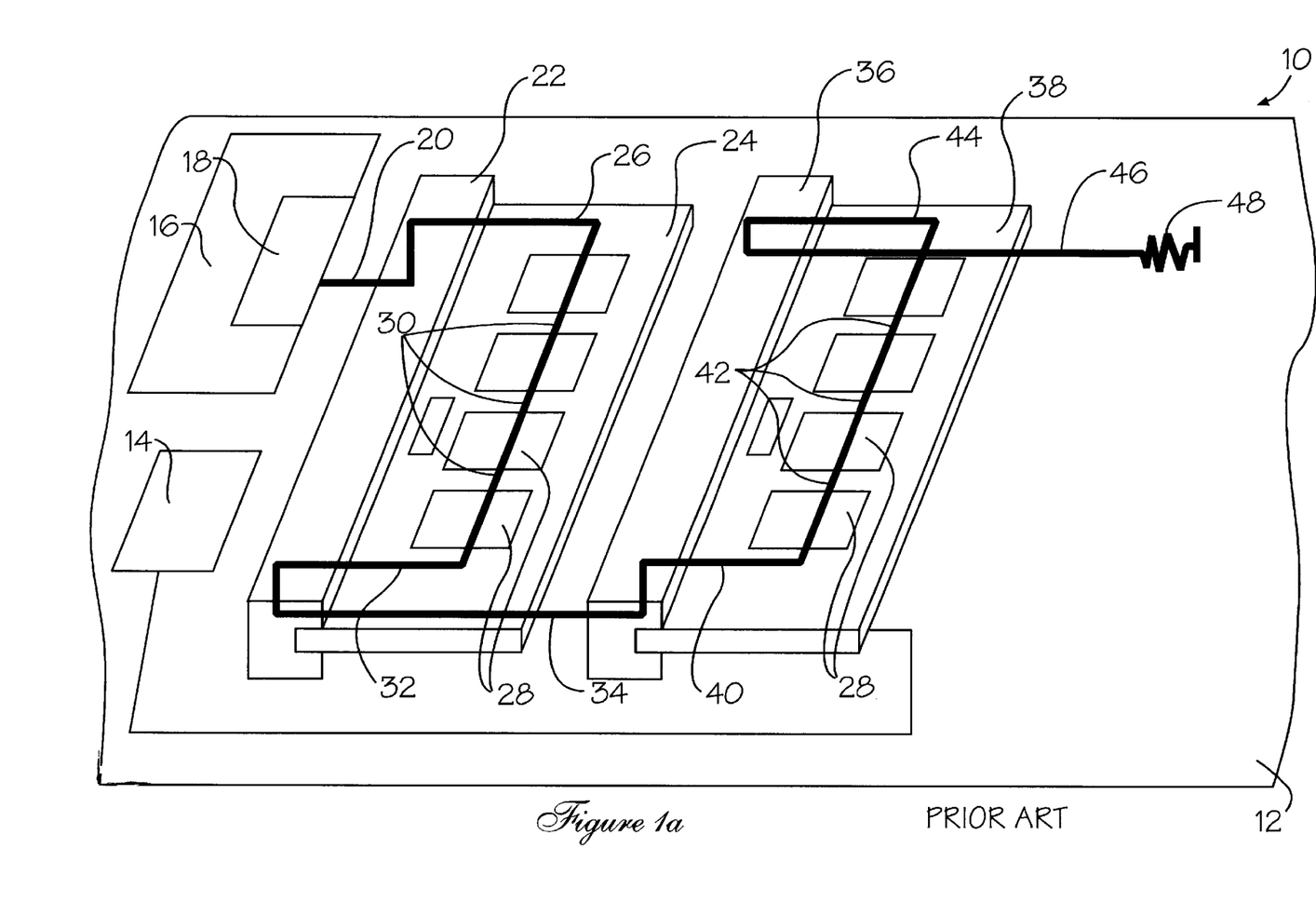
FIG. 1a is schematic representation of a multi-card memory arrangement of the prior art with bus termination on the motherboard.

Referring first to FIG. 1a, there is shown a schematic representation of a multi-card (two-card) memory system 10 of the prior art. Conventional two-slot and three-slot boards require terminations on the motherboard 12, which are needed even when all slots were not used. Signal quality is proportionally degraded by the electrically noisy, standard card-on-board connectors 22, 36, which provide signal paths between RIMM cards 24, 38 and circuitry on the motherboard 12.

While RAMBUS-based memory subsystems have been chosen for purposes of disclosure, it should be obvious that the principles taught by the instant invention can be applied not only to other high speed memory subsystems, such as Double Data Rate (DDR) Synchronous Dynamic Random Access Memory (SDRAM), but also to a wide variety of electronic packaging structures for many other applications requiring high speed and high performance including but not limited to microprocessor-based, digital signal processor-based, and telecommunications-based applications and subsystems.

A portion of a motherboard 12 is shown with support circuitry needed for implementing the RAMBUS memory system. A Direct RAMBUS Clock Generator (DRCG) circuit 14 and a master device 16 containing a Direct RAMBUS ASIC Cell (DRAC) 18 are implemented on motherboard 12. The RAMBUS channel segment 20 connects DRAC 18 to a first connector 22, which is physically connected to motherboard 12. RAMBUS channel segment 20 connections are generally made by internal printed wiring traces (not shown). First connector 22 generally has a plurality of spring-loaded contacts designed to engage mating contact pads on a first RIMM card 24.

In the RAMBUS architecture, 184 contacts are generally provided on each memory module. RAMBUS channel segment 20 enters first RIMM card 24 at a bus entry region 26 and is then connected to a number of individual memory devices 28 attached to RIMM card 24 through device connection segments 30. The RAMBUS channel next exits RIMM card 24 via a RAMBUS channel exit region 32, and passes from first RIMM card 24 back to motherboard 12. Additional printed wiring traces carry the RAMBUS channel segment 34 to a second connector 36 also on motherboard 12. Second connector 36 holds a second RIMM card 38.

A RAMBUS channel entry portion 40, a series of memory devices 28, a series of device connection segments 42, and a RAMBUS channel exit portion 44 make up second RIMM card 38. RAMBUS channel segment 46 finally reaches terminations 48 at the end of the circuitous routing of the bus after passing through printed circuit traces.

Termination components, such as resistors, blocking capacitors and/or decoupling capacitors 48 are also placed on motherboard 12. All RAMBUS channel signals must pass through two connectors 22, 36 and across two RIMM cards 24, 38 before reaching terminations 48. Signal degradation occurs along the path of the RAMBUS channel, especially at connectors 22 and 36. In addition, valuable "real estate" is consumed on the motherboard 12, itself.

RIMM cards 24, 38 typically are printed circuit structures, comprising epoxy-glass-based materials (i.e., FR4) and include one or more conductive (i.e., signal, power and/or ground) layers therein. Due to the stringent RAMBUS electrical specifications, the signal traces must match the system impedance within ten percent.

Figure 1B:
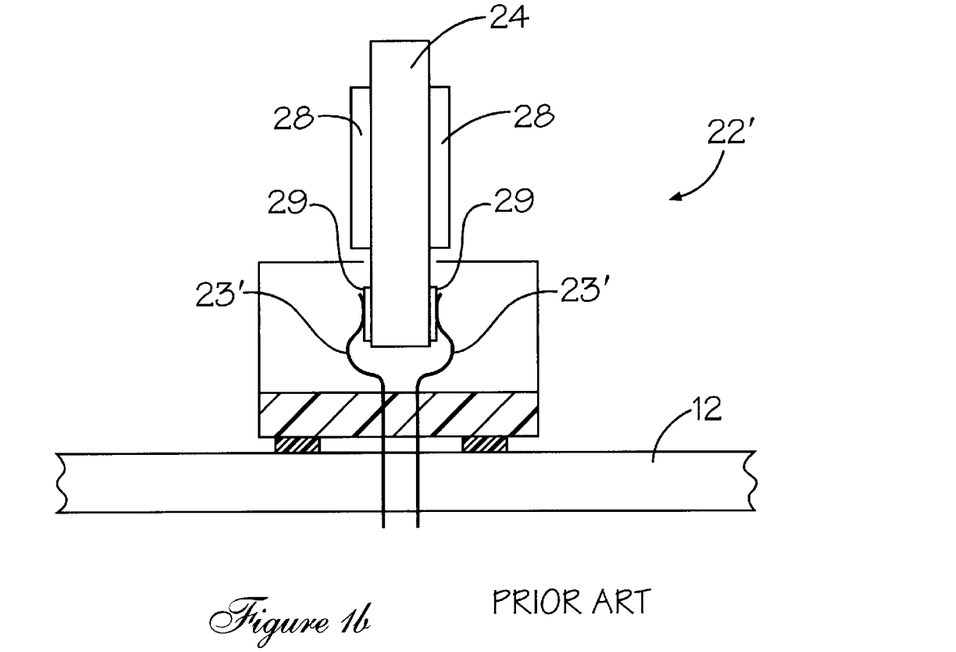
Figure 1C:
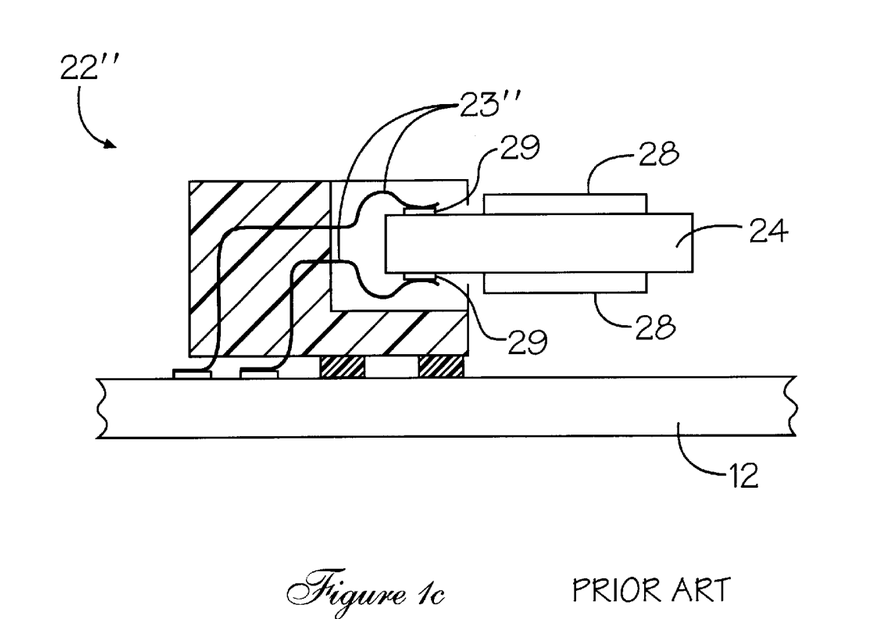

The connectors shown hereinbelow in FIGS. 1b and 1c are vertical and horizontal physical representations, respectively, of the schematic connectors 22, 36 of FIG. 1a. Since connectors 22 and 36 are typically the same, only connector 22 is described in FIGS. 1b and 1c.

Referring now to FIG. 1b, there is shown a cross sectional, enlarged view of a vertical plated-through-hole attach connector and memory card of the prior art shown in FIG. 1a. Spring-loaded contacts 23' of connector 22' provide electrical connection between motherboard 12 and contact pads 29 on RIMM card 24. Connectors 22' of this type are available with either plated-through-hole attach or surface-mount attach to a structure such as motherboard 12 (FIG. 1a), with the plated-through-hole attach style being electrically inferior but more commonly used. In either case, the spring-loaded contacts 23' of connector 22' result in a significant electrical discontinuity, especially at today's high bus speeds. This impedance discontinuity is manifested in terms of increased electrical noise and time delay due to reflections. Also this vertical style of connector is unusable in low profile applications.

Referring now to FIG. 1c, there is shown a cross sectional, enlarged view of a low profile connector and a RIMM card of the prior art shown in FIG. 1a. Spring-loaded contacts 23" of connector 22" provide electrical connection between motherboard 12 and contact pads 29 on RIMM card 24. Connectors 22" of this type are primarily surface-mount attached to a structure such as motherboard 12 (FIG. 1a). Again the spring-loaded contacts 23" create a significant electrical discontinuity, especially at today's high bus speeds. This horizontal style of connector 22" does have a much lower profile to make it usable in low profile applications, but requires much more motherboard real estate in multi-card applications. A two-level stacked version of this connector is available, but since the connections to the spring contacts are even longer, the electrical discontinuity, and therefore the electrical noise is even worse.

The specific arrangement and location of memory devices 28 on modules 24, 38 may vary depending on the specific application and does not really affect the prior art nor the invention disclosed hereinbelow, but the quantity of memory devices is subject to RAMBUS specifications and limitations.

Figure 2A:
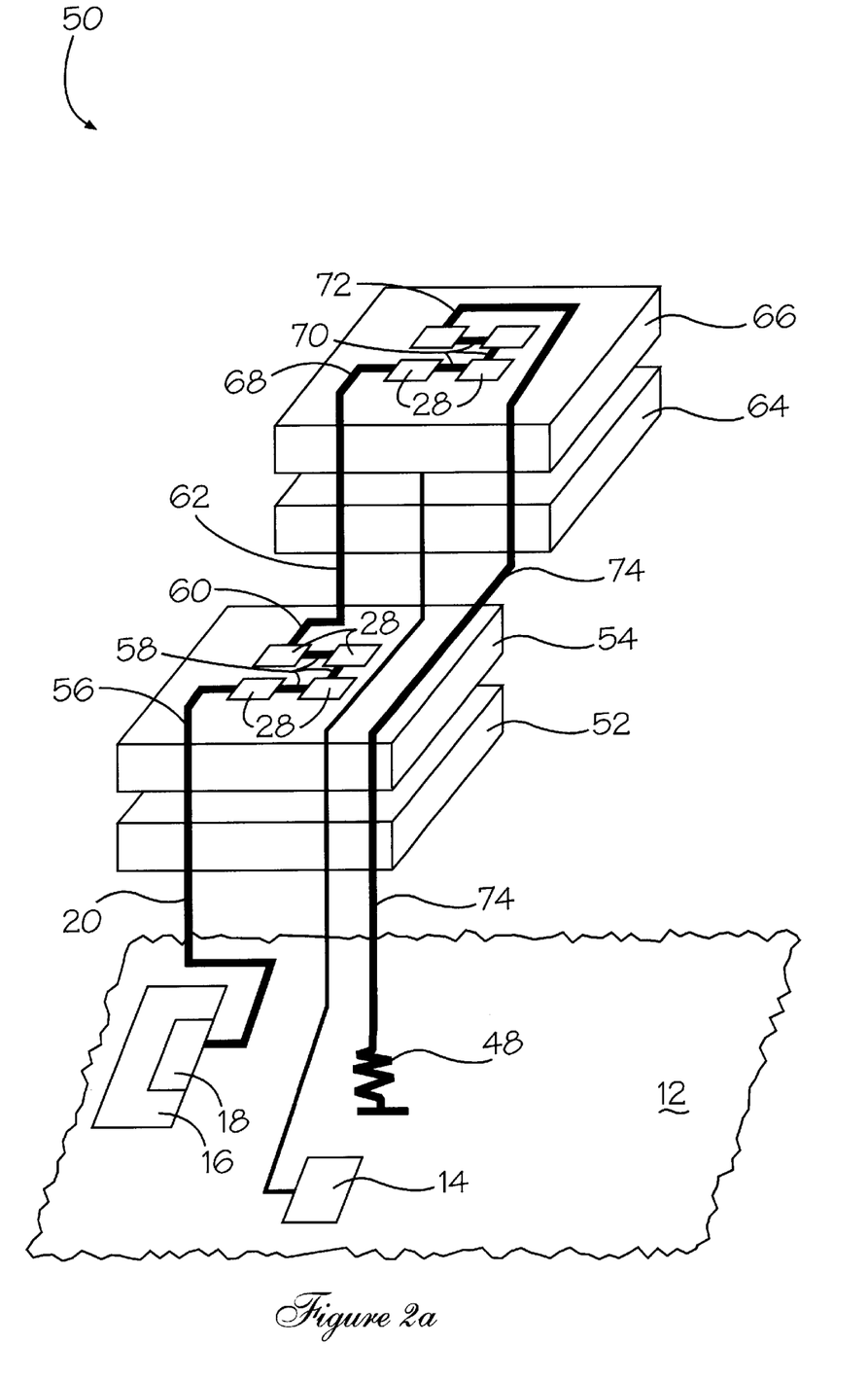
FIG. 2a is a schematic representation of a low profile memory arrangement of a first embodiment of the present invention with bus termination on the motherboard.
Figure 2B:
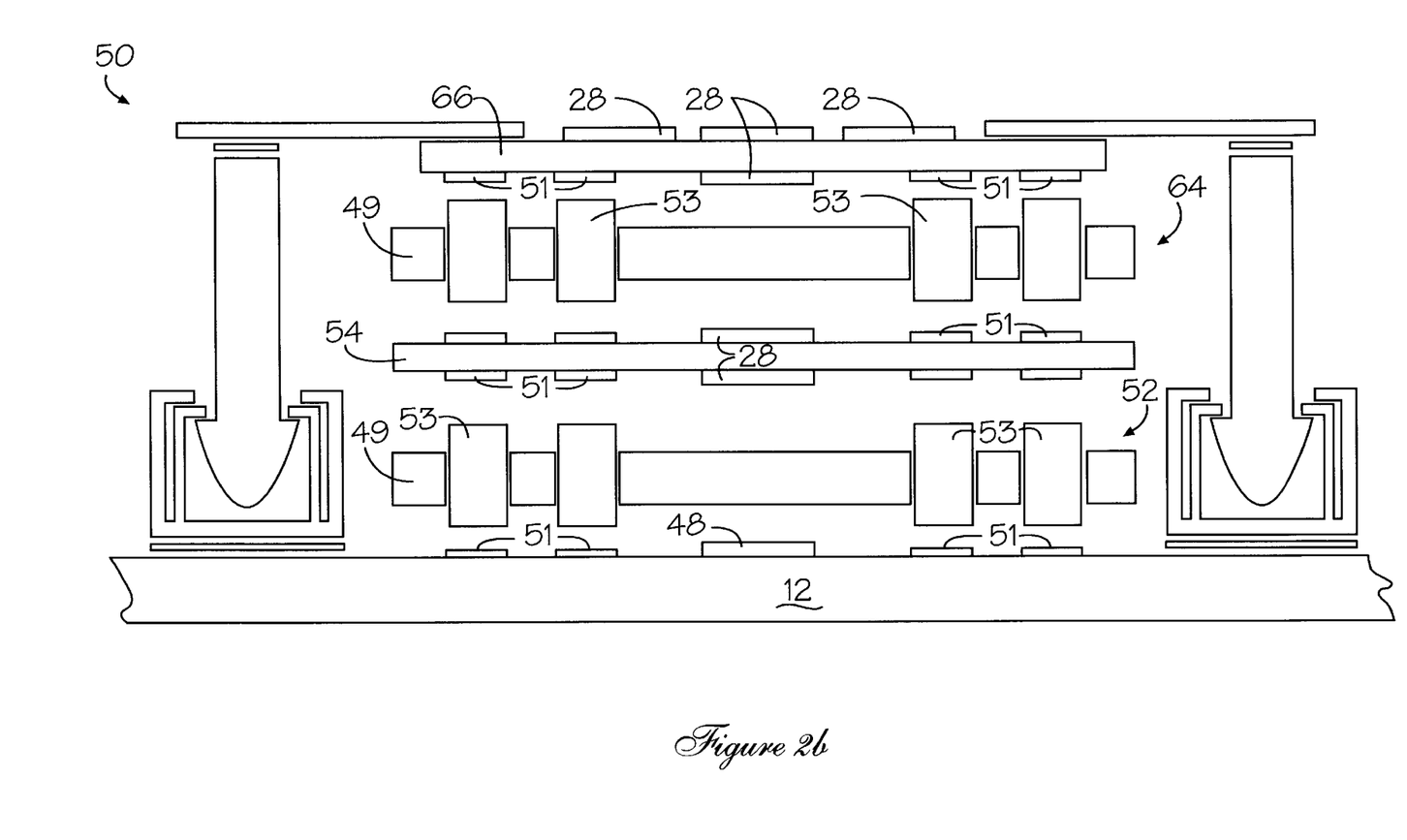
Figure 3A:
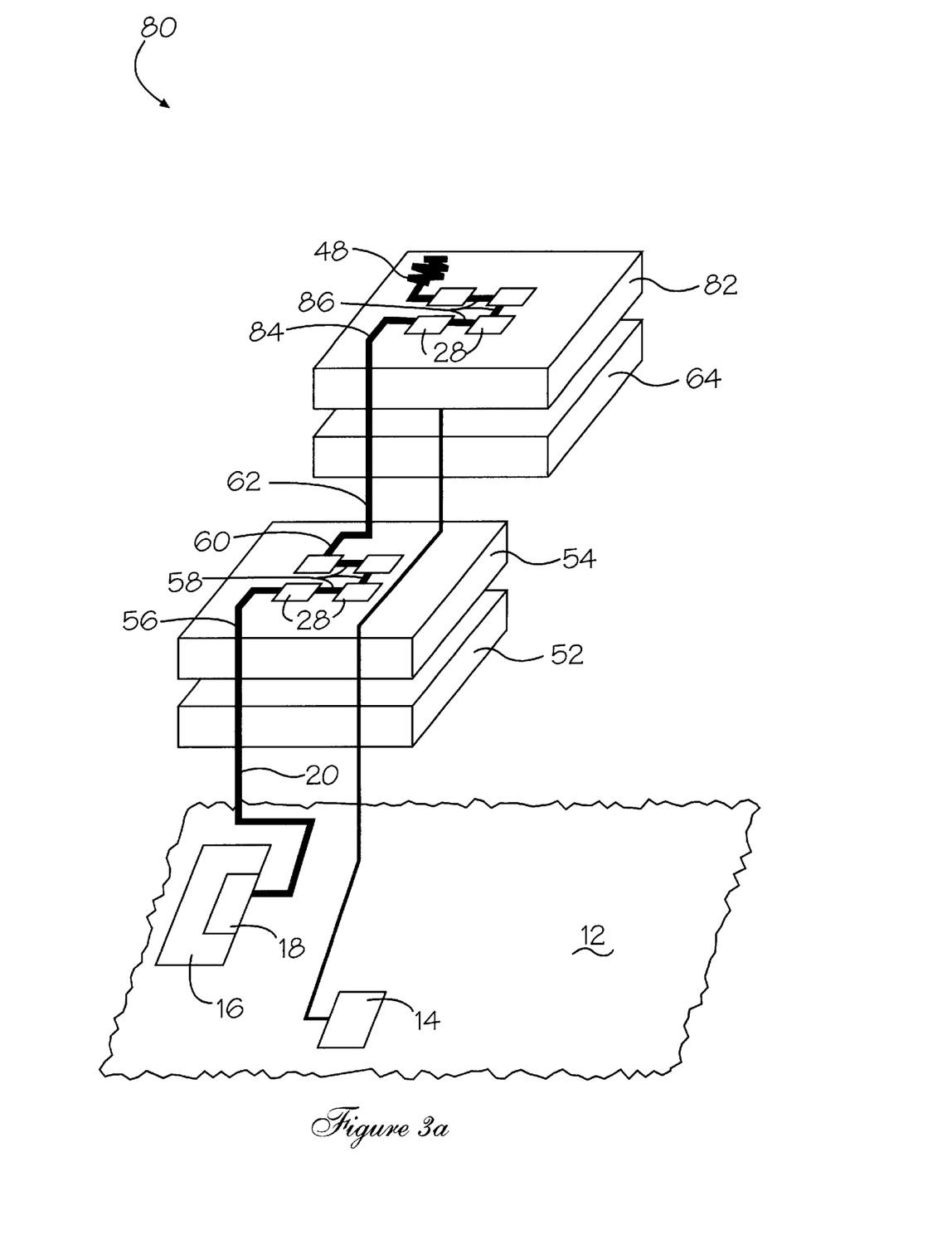
FIG. 3a is a schematic representation of a low profile memory arrangement of a second embodiment of the present invention with bus termination on the last memory card.
Figure 3B:
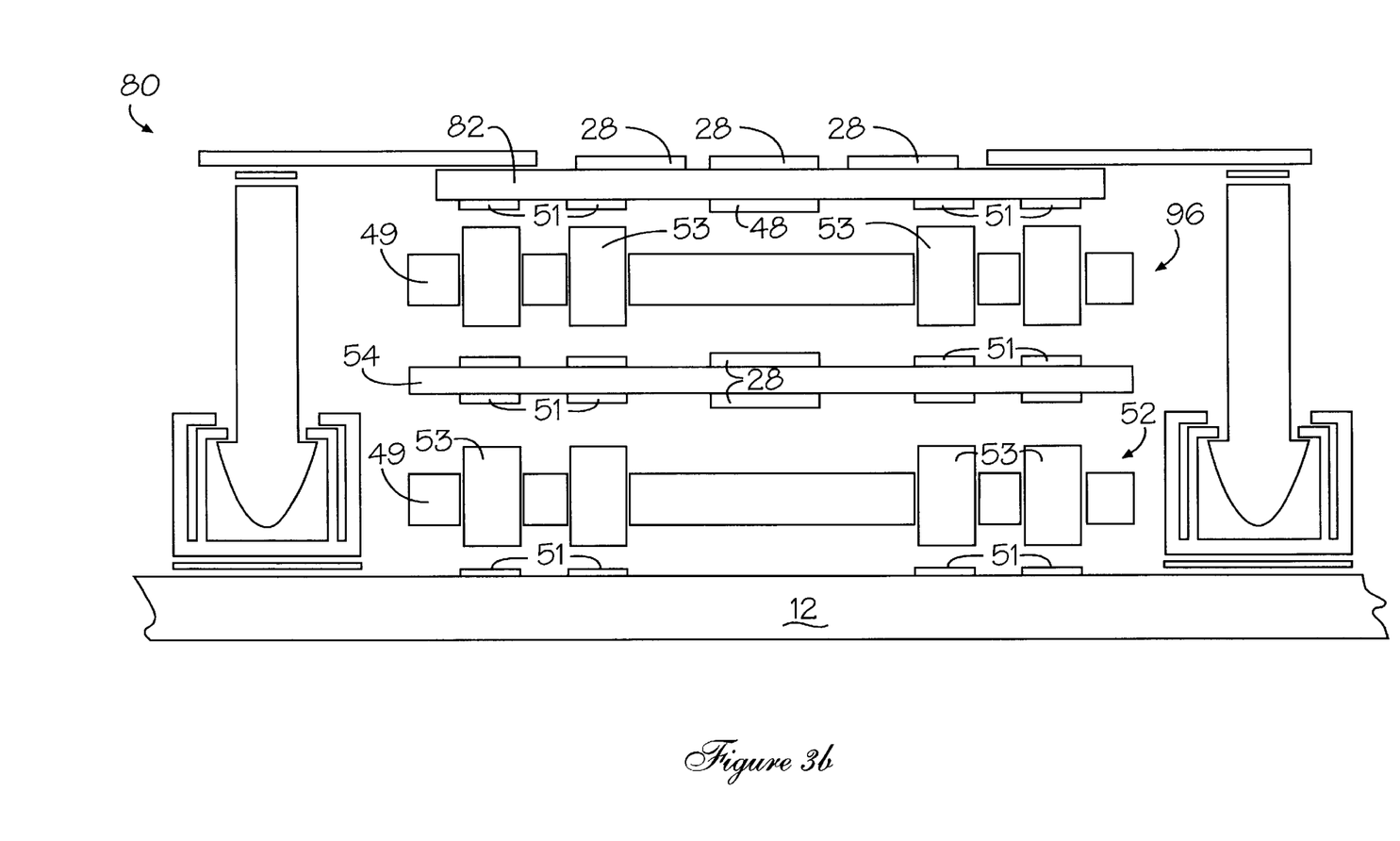
Figure 4A:
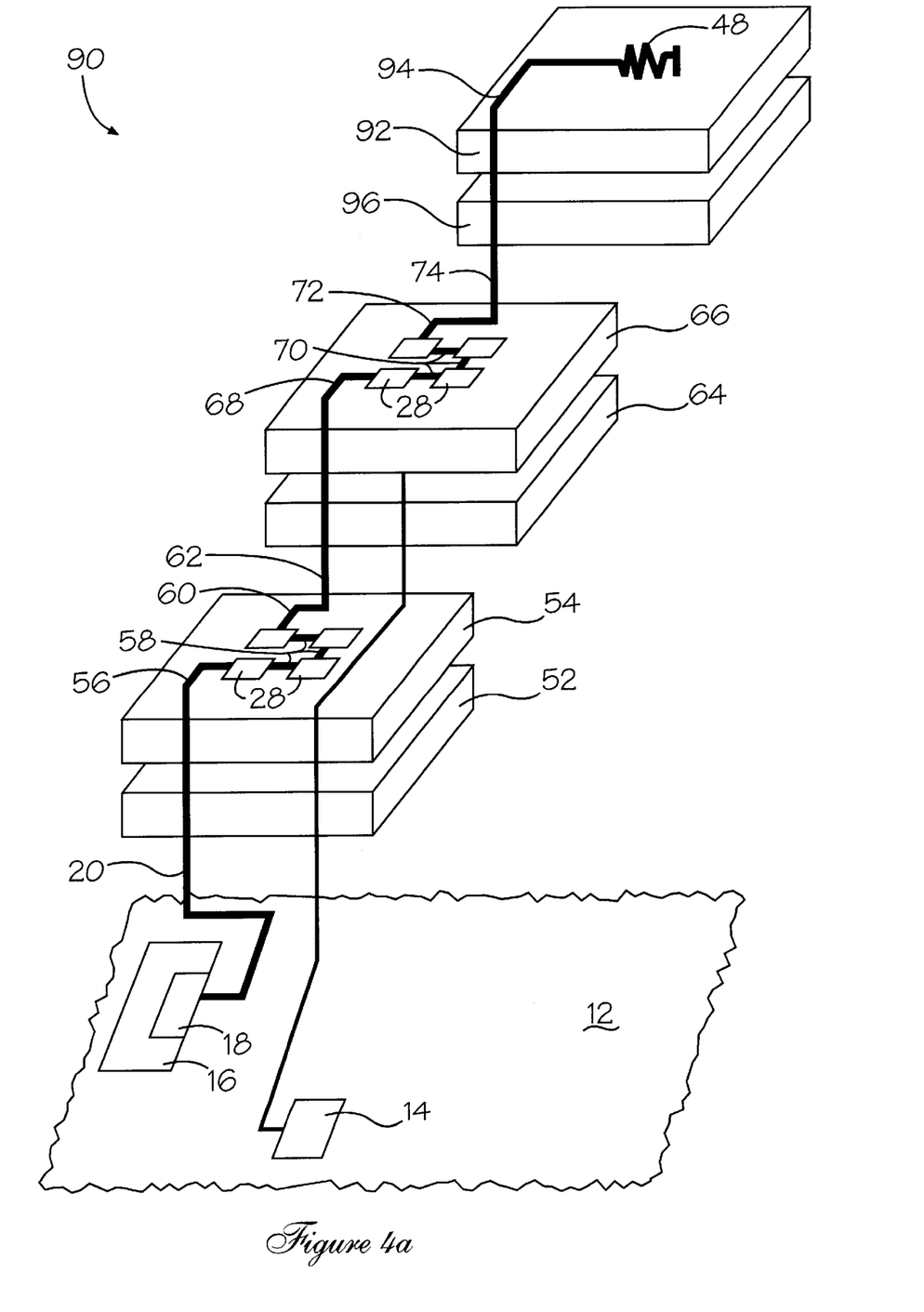
FIG. 4a is a schematic representation of a low profile memory arrangement of a third embodiment of the present invention with bus termination on a separate termination card.
Figure 4B:
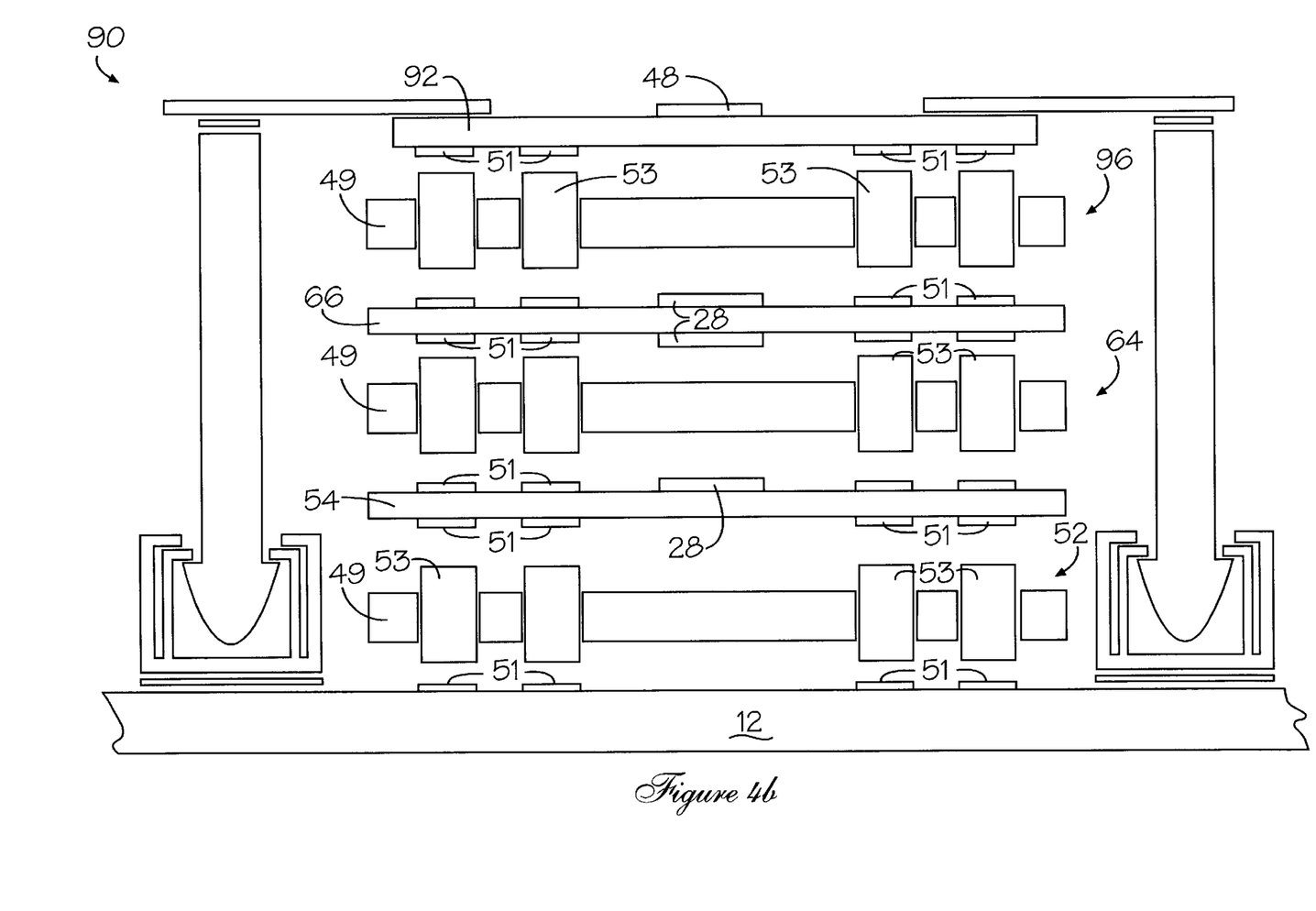

Three implementations of low profile memory arrangements are disclosed hereinbelow in accordance with different embodiments of the invention, with the primary difference being that the example in FIGS. 2a and 2b shows the bus termination 48 on the motherboard 12, the example in FIGS. 3a and 3b shows the bus termination 48 on the last card 82, and the example in FIGS. 4a and 4b shows bus termination 48 on a separate termination card 92.

Referring now to FIG. 2a, there is shown a schematic representation of the inventive low profile memory card system 50. A portion of a motherboard 12 is again shown with support circuitry needed for implementing the RAMBUS memory system. A DRCG circuit 14 and a master device 16 containing a DRAC 18 are implemented on motherboard 12 in the same manner as in the prior art memory card implementation shown in FIG. 1a and discussed hereinabove.

The RAMBUS channel segment 20 connects DRAC 18 to an LGA connector 52. Again, RAMBUS channel segment 20 connections are generally made by printed wiring traces (not shown) on one or more of the layers (not shown). of motherboard 12. LGA connector 52 is disposed between motherboard 12 and first card 54, and provides electrical interconnection therebetween. LGA connectors 52, 64 generally have a plurality of short resilient contact members 53 (FIG. 2b) designed to engage mating contact pads 51 on motherboard 12 and first card 54, and again from first card 54 to second card 66. It is preferable that the housing/carrier 49 of LGA connectors 52, 64 have a coefficient of thermal expansion (CTE) that closely matches that of the surrounding cards 54, 66.

Contact members 53 are preferably of a construction and composition as taught in one of the referenced copending U.S. patent applications and further enhanced electrically and mechanically by the teachings of two other copending U.S. patent applications. Compared to prior art pin-and-socket LGA connectors, connectors 52, 64 of the present invention provide improved performance, increased density, lower height, and a CTE that better matches the surrounding structures. Also, due to the lower force per contact required by connectors 52 and 64, the number of contacts allowed for a given amount of retention force significantly increases.

RAMBUS channel segment 20 enters first card 54 at a bus entry region 56 and is then connected to a number of individual memory devices 28 attached to card 54 through device connection segments 58. The RAMBUS channel next exits card 54 via a RAMBUS channel exit region 60, and RAMBUS channel segment 62 passes from first card 54 directly to second card 66 through LGA connector 64 instead of back through motherboard 12.

A RAMBUS channel entry portion 68, a series of memory devices 28, a series of device connection segments 70, and a RAMBUS channel exit portion 72 make up second card 66. RAMBUS channel segment 74 reaches terminations 48 after passing the short distance back through other contact members 53 of connectors 64 and 52. As with the prior art case, termination components, such as resistors, blocking capacitors and/or decoupling capacitors 48 are again placed on motherboard 12.

Cards 54 and 66 (FIG. 2b) typically are printed circuit structures, comprising epoxy-glass-based materials (i.e., FR4) and include one or more conductive (i.e., signal, power and/or ground) layers therein. Other materials may be used for various reasons, including electrical performance, wirability, and thermal performance, but the epoxy-glass-based materials are cost-effective and have a CTE that matches that of motherboard 12 and LGA connectors 52 and 64. Again due to the stringent RAMBUS electrical specifications, the signal traces must match the system impedance within ten percent.

Referring now to FIGS. 3a and 3b, there is shown a schematic representation of the inventive low profile memory card system 80. A portion of a motherboard 12 is again shown with support circuitry needed for implementation of the RAMBUS memory system. A DRCG circuit 14 and a master device 16 containing a DRAC 18 are implemented on motherboard 12 in the same manner as in the embodiment shown in FIG. 2a and discussed hereinabove. First card 54 is also unchanged. Second card 82 comprises a RAMBUS channel entry portion 84, a series of memory devices 28, and a series of device connection segments 86. But unlike the embodiment in FIGS. 2a and 2b, terminations 48 are mounted directly on card 82, thereby eliminating the need for an exit portion of RAMBUS channel 72 (FIG. 2a) and RAMBUS channel segment 74. A complete, additional set of contacts is thereby eliminated, allowing their use for addressing additional memory capacity or the like, and simplifying and cost reducing card 82. In one case the printed circuit board was reduced from eight layers to six. Another advantage of placing terminations 48 on card 82 is that less noise is coupled into motherboard 12, potentially enhancing the performance of the entire system.

Referring now to FIGS. 4a and 4b, there is shown a schematic representation of the inventive low profile memory card system 90. A portion of a motherboard 12 is again shown with support circuitry needed for implementation of the RAMBUS memory system. A DRCG circuit 14 and a master device 16 containing a DRAC 18 are implemented on motherboard 12 in the same manner as in the embodiments shown in FIGS. 2a and 3a and discussed hereinabove. But in order to best handle certain applications, this embodiment borrows from both of the previous embodiments. While the benefits of on-card termination are well understood and very desirable for all of the reasons hereinabove, from a manufacturing and logistical point of view, it is equally desirable to have primarily identical memory cards. One way to accomplish this is to start with the two cards 54, 66 of FIGS. 2a and 2b, but to have terminations 48 mounted on a separate termination card 92. Termination card 92 further comprises a RAMBUS channel entry portion 94 and is connected through connector 96.

In the present invention, since a retentive force is not inherent as in a pin-and-socket type interconnection, a clamping mechanism creates the force necessary to ensure each contact member 53 of connectors 52, 64, 96 is compressed an appropriate amount during engagement to form the required interconnections to the circuit elements. It is preferable that the clamping mechanism not require any mounting holes in motherboard 12, provide a controlled and uniform displacement of force over the array of contact members 53, avoid problems with CTE mismatches, and be field separable to facilitate repairs and upgrades by the end user.

Although a means for aligning cards 54, 66, 82 to motherboard 12 has not been shown specifically in this embodiment, it should be readily apparent to those skilled in the art of the multitude of methods that may be implemented.

The natural cooling efficiency of low profile memory card systems 50, 80, 90 is low due to the lack of an effective thermal transfer medium from the die or package of memory devices 28 to the air, and the lack of a short air channel in the direction of air flow (i.e., parallel to motherboard 12). It is exacerbated by the relatively large size of today's memory devices 28 and the proximity to other heat generating memory devices 28 in such a dense package. Thermal management structures (not shown) may be included in the inventive systems to optimize both thermal conduction and radiation, thus allowing maximum circuit density without heat build-up, which could degrade the performance and reliability of memory devices 28.

Thermal management structures are intended to sink heat away from memory devices 28 and may be implemented in many ways. They may be as simple as a layer of thermally conductive material, such as aluminum, attached or retained to memory devices 28 by thermally enhanced compounds or clamps. The structures may be more complex and include elements such as fins to augment cooling. Other methods may include the use of conformal pouches of liquid thermal transfer material, thin heat pipes, and thermoelectric devices. Even other methods of solving thermal issues will be obvious to those skilled in the art.

Although the three implementations disclosed hereinabove are each shown with two cards of memory devices for purposes of disclosure, it should be obvious to those skilled in the art that parameters such as the quantity, specific shape, dimensions, and materials of the cards, and the number and packaging of memory devices may vary depending on certain requirements. These types of variations are well within the scope of the present invention.

Hereinbelow, the following are benefits and advantages, which are present in all of the embodiments of the present invention.

Compared to the prior art RIMM cards 24, 38 (where all contacts must be located along a single edge), cards 54, 66, 82 all allow contact pads to be optimally located in many ways to enhance parameters such as contact density, wirability, reliability, and electrical and mechanical performance. This can also optimize motherboard 12 as well.

Figure 5A:
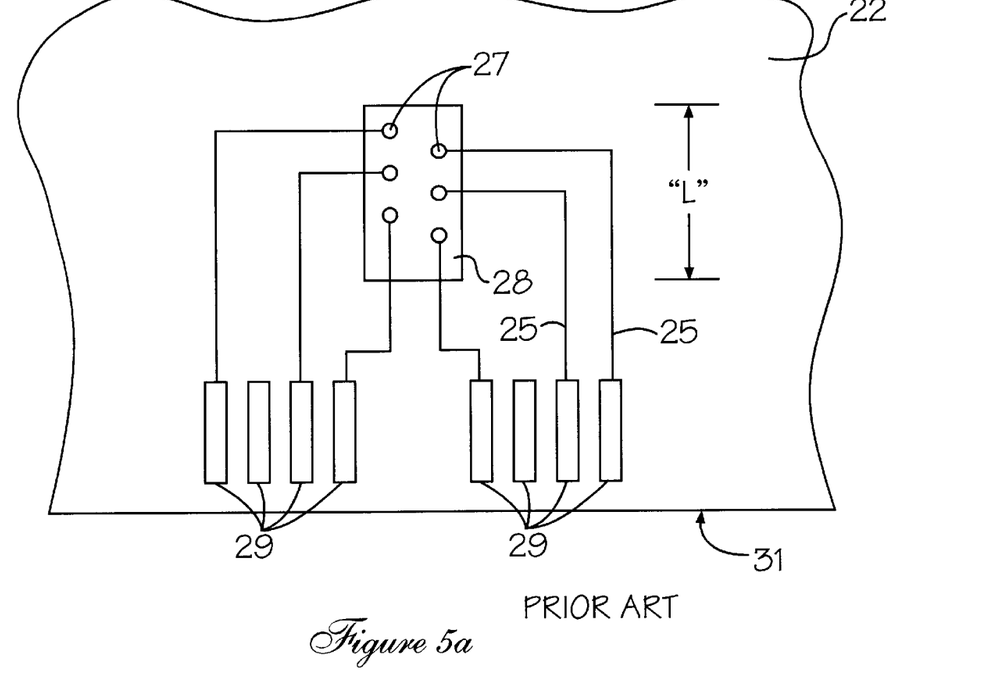
FIG. 5a shows a memory device, contact pads and wiring therebetween on a prior art RIMM card.
Figure 5B:
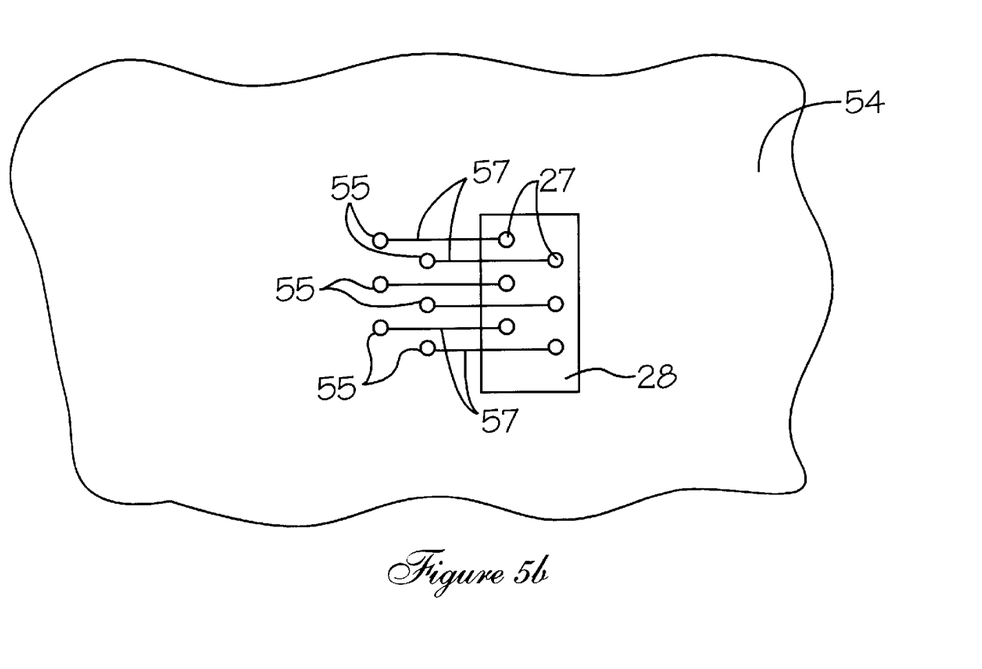

One example of how the instant invention provides a method to optimize the electrical characteristics of the signal connections on card 54, 66, 82 compared to the prior art (FIG. 5a) is shown in a bottom-side through view in FIG. 5b. FIG. 5a shows the typical wiring of a memory device 28 to contact pads 29 on a RIMM card 24, 38. The length of the signal connections 25 to connect to the device contact pads 27 of memory devices 28 varies by at least the length of the memory device 28, "L", since all signals enter and exit the RIMM card 22, 36 through the same edge 31. This leads to differences in time delay and coupled noise for each of the signal connections. In the present invention (FIG. 5b, by judicious placement of the contact pads 55 on card 54, 66, 82, it is possible to both minimize and equalize the length, and therefore optimize the electrical performance of all signal connections 57 on the cards 54, 66, 82.

An additional benefit of the method of optimization shown in FIG. 5b is the significant amount of real estate that is saved. In some cases it can allow cards 54, 66, 82 (FIGS. 2b, 3b) to be smaller in size and/or complexity. In others cases the additional real estate can be used to improve the electrical performance of the low profile memory card systems 50, 80, 90 (FIGS. 2b, 3b, 4b. In one example, the electrical performance of critical nets such as clock lines can be improved by allowing the separation/segregation of these nets/lines from noisier nets.

Signal degradation occurs along the path of all RAMBUS channels, especially at connectors. It may be seen that, compared to the conventional RAMBUS-based memory subsystems as shown in FIGS. 1a–1c, the total bus path length, and therefore the total time delay of the inventive memory subsystems is significantly reduced. Any reduction of bus length eases the driver requirements for devices on the bus, both reducing cost and improving reliability.

Generally, higher memory access speeds may be obtained by improving the quality of the RAMBUS channel (i.e., reducing its length, channel delay, crosstalk, etc.). The reduced path length as well as. eliminating connectors between memory cards and terminations significantly improve the electrical integrity. In one example electrically unshielded spring loaded contacts 23', 23" in the prior art connectors 22', 22" are 0.150 inch in length, while in the present invention, contact members 53 in connectors 52, 64 are only 0.060 inch long. When contact members 53 are packaged in a shielded housing as taught in one of the referenced copending U.S. patent applications, the electrical discontinuity is minimal. For a signal to traverse from a first card 54 to a second card 66, 82 in the present invention, the signal degradation of passing through two long, unshielded, electrically noisy connectors 22, 36 and a RAMBUS channel segment 34 (FIG. 1a) is eliminated. This also simplifies the wiring of and/or cost reduces motherboard 12.

The removal and shortening of connectors improves electromagnetic interference (EMI) susceptibility and also reduce radiated radio frequency (RF) emissions from the motherboard 12 and cards 54, 66, 82.

Compared to the prior art circuit RIMM card 24, 38 (FIGS. 1a and 1b), where only a certain number (e.g., eight or sixteen) of memory devices 28 is allowed, the present invention allows full use of all of the real estate available on cards 54, 66, 82 for maximum density by allowing other partitioning of memory devices 28 otherwise not available.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Pat. is presented in the subsequently appended claims.

What is claimed is:

1. An electronic package for high frequency semiconductor devices, comprising:
   a) a plurality of circuit members each having a first surface and a second surface, and having a plurality of contact pads disposed on said first surfaces, at least one of said contact pads for connecting to an external data bus;
   b) first electrical connection means, including a contact member to provide electrical interconnection, operatively connected to at least one of said conductive pads on said first surface of at least one of said circuit members forming an extension of said external data bus;
   c) at least one semiconductor device located on at least one of said surfaces of said plurality of circuit members and selectively connected to said data bus extension;
   d) a plurality of contact pads disposed on said second surface of at least one of said circuit members, at least one of said contact pads further extending said external data bus;
   e) clamping means attached to at least one of said circuit members to compress said contact member of said first electrical connection means; and
   f) bus termination means operatively connected to said data bus extension.

2. The electronic package for high frequency semiconductor devices as recited in claim 1, wherein said external data bus comprises a characteristic impedance and said bus termination means exhibits an impedance substantially matching said characteristic impedance.

3. The electronic package for high frequency semiconductor devices as recited in claim 1, further comprising alignment means operatively connected to at least one of said circuit members for aligning said first electrical connection means thereto.

4. The electronic package for high frequency semiconductor devices as recited in claim 1, further comprising second electrical connection means disposed intermediate two of said circuit members and operatively connected to at least one conductive pad on said first surface and at least one conductive pad on said second surface of at least one of said circuit members.

5. The electronic package for high frequency semiconductor devices as recited in claim 4, further comprising alignment means operatively connected to at least one of said circuit members for aligning said second electrical connection means thereto.

6. The electronic package for high frequency semiconductor devices as recited in claim 2, wherein said bus termination means comprises at least one electrical component from the group: resistors, capacitors and inductors.

7. The electronic package for high frequency semiconductor devices as recited in claim 6, wherein said resistors comprise discrete resistors.

8. The electronic package for high frequency semiconductor devices as recited in claim 6, wherein said resistors comprise a resistor pack.

9. The electronic package for high frequency semiconductor devices as recited in claim 6, wherein said resistors comprise a solid-state resistive device.

10. The electronic package for high frequency semiconductor devices as recited in claim 2, wherein said bus termination means is located external to said electronic package.

11. The electronic package for high frequency semiconductor devices as recited in claim 2, wherein said bus termination means is located on one of said circuit members.

12. The electronic package for high frequency semiconductor devices as recited in claim 2, further comprising a termination module and wherein said bus termination means is located on said termination module.

13. The electronic package for high frequency semiconductor devices as recited in claim 1, wherein said first electrical connection means is a land grid array connector.

14. The electronic package for high frequency semiconductor devices as recited in claim 13, wherein said land grid array connector is a Superbutton™-based connector provided by High Connection Density, Inc.

15. The electronic package for high frequency semiconductor devices as recited in claim 1, wherein at least one of said semiconductor devices is a memory device.

16. The electronic package for high frequency semiconductor devices as recited in claim 1, wherein said circuit members comprise wiring means connecting at least one of said contact pads on said first surface to at least one of said contact pads on said second surface.

17. The electronic package for high frequency semiconductor devices as recited in claim 1, wherein said circuit members comprise a multi-layer printed circuit card.

18. The electronic package for high frequency semiconductor devices as recited in claim 1, wherein at least one of said semiconductor devices comprises at least one from the group of: bare chip, thin, small-outline packages (TSOP), chip scale packages (CSP) and chip on board (COB).

19. The electronic package for high frequency semiconductor devices as recited in claim 1, wherein said plurality of circuit members is substantially parallel to one another.

20. The electronic package for high frequency semiconductor devices as recited in claim 19, further comprising an external printed circuit structure and wherein said plurality of circuit members is substantially parallel to said external printed circuit structure.

21. The electronic package for high frequency semiconductor devices as recited in claim 1, further comprising thermal management structures.

22. The electronic package for high frequency semiconductor devices as recited in claim 21, wherein said thermal management structures comprise heat-conductive fins in thermal contact with said at least one semiconductor device.

23. The electronic package for high frequency semiconductor devices as recited in claim 1, wherein said external data bus comprises at least two external data buses; said extension of said external data bus comprises at least two extensions of said two data buses; and said semiconductor device comprises two groups of at least one semiconductor device, each group being independently connected to one of said two data bus extensions.

24. The electronic package for high frequency semiconductor devices as recited in claim 1, wherein said at least one semiconductor device comprises a pattern of contact pads on a first surface of said at least one semiconductor device.

25. The electronic package for high frequency semiconductor devices as recited in claim 24, wherein at least a portion of said plurality of contact pads on one surface of said plurality of circuit members is arranged in a pattern substantially the same as said pattern of contact pads on said first surface of said at least one semiconductor device.

26. The electronic package for high frequency semiconductor devices as recited in claim 25, further comprising interconnections between said pattern of contact pads on said plurality of circuit members and said pattern of contact pads on said at least one semiconductor device.

27. The electronic package for high frequency semiconductor devices as recited in claim 26, wherein said interconnections are approximately equal in length, said length is shortened and length adjustment for matching said length of said interconnections is minimized.

28. The electronic package for high frequency semiconductor devices as recited in claim 27, wherein said interconnections are approximately equal propagation delays, said propagation delays are shortened and propagation delay adjustment for matching said propagation delays of said interconnections is minimized.

29. An electronic package for high frequency semiconductor devices, comprising:
a) a plurality of circuit members each having a first surface and a second surface, and having a plurality of contact pads disposed on said first surfaces, at least one of said contact pads for connecting to an external data bus;
b) first electrical connection means, including a contact member to provide electrical interconnection, operatively connected to at least one of said conductive pads on said first surface of at least one of said circuit members forming an extension of said external data bus;
c) at least one semiconductor device located on at least one of said surfaces of said plurality of circuit members and selectively connected to said data bus extension, said at least one semiconductor device comprises a first pattern of contact pads on a first surface thereon;
d) a plurality of contact pads disposed on said second surface of at least one of said circuit members, at least one of said contact pads further extending said external data bus;
e) clamping means attached to at least one of said circuit members to compress said contact member of said first electrical connection means;
f) bus termination means operatively connected to said data bus extension; and
wherein at least a portion of said plurality of contact pads on one surface of said plurality of circuit members is arranged in a second pattern substantially the same as said first pattern of contact pads on said first surface of said at least one semiconductor device.

30. The electronic package for high frequency semiconductor devices as recited in claim 29, at least one of said plurality of circuit members further comprising a plurality of mating pads and interconnections extending from said first pattern of contact pads on said at least one semiconductor device to said second pattern of contact pads on said plurality of circuit members.

31. The electronic package for high frequency semiconductor devices as recited in claim 30, wherein said interconnections are approximately equal in length, said length is shortened and length adjustment for matching said length of said interconnections is minimized.

32. The electronic package for high frequency semiconductor devices as recited in claim 31, wherein said interconnections are approximately equal propagation delays, said propagation delays are shortened and propagation delay adjustment for matching said propagation delays of said interconnections is minimized.

33. The electronic package for high frequency semiconductor devices as recited in claim 29, wherein said external data bus comprises a characteristic impedance and said bus termination means exhibits an impedance substantially matching said characteristic impedance.

34. The electronic package for high frequency semiconductor devices as recited in claim 29, further comprising alignment means operatively connected to at least one of said circuit members for aligning said first electrical connection means thereto.

35. The electronic package for high frequency semiconductor devices as recited in claim 29, further comprising second electrical connection means disposed intermediate two of said circuit members and operatively connected to at least one conductive pad on said first surface and at least one conductive pad on said second surface of at least one of said circuit members.

36. The electronic package for high frequency semiconductor devices as recited in claim 35, further comprising alignment means operatively connected to at least one of said circuit members for aligning said second electrical connection means thereto.

37. The electronic package for high frequency semiconductor devices as recited in claim 33, wherein said bus termination means comprises at least one electrical component from the group: resistors, capacitors and inductors.

38. The electronic package for high frequency semiconductor devices as recited in claim 37, wherein said resistors comprise discrete resistors.

39. The electronic package for high frequency semiconductor devices as recited in claim 37, wherein said resistors comprise a resistor pack.

40. The electronic package for high frequency semiconductor devices as recited in claim 37, wherein said resistors comprise a solid-state resistive device.

41. The electronic package for high frequency semiconductor devices as recited in claim 33, wherein said bus termination means is located external to said electronic package.

42. The electronic package for high frequency semiconductor devices as recited in claim 33, wherein said bus termination means is located on one of said circuit members.

43. The electronic package for high frequency semiconductor devices as recited in claim 33, further comprising a termination module and wherein said bus termination means is located on said termination module.

44. The electronic package for high frequency semiconductor devices as recited in claim 29, wherein said first electrical connection means is a land grid array connector.

45. The electronic package for high frequency semiconductor devices as recited in claim 44, wherein said land grid array connector is a Superbutton™-based connector provided by High Connection Density, Inc.

46. The electronic package for high frequency semiconductor devices as recited in claim 29, wherein at least one of said semiconductor devices is a memory device.

47. The electronic package for high frequency semiconductor devices as recited in claim 29, wherein said circuit members comprise wiring means connecting at least one of said contact pads on said first surface to at least one of said contact pads on said second surface.

48. The electronic package for high frequency semiconductor devices as recited in claim 29, wherein said circuit members comprise a multi-layer printed circuit card.

49. The electronic package for high frequency semiconductor devices as recited in claim 29, wherein at least one of said semiconductor devices comprises at least one from the group of: bare chip, thin, small-outline packages (TSOP), chip scale packages (CSP) and chip on board (COB).

50. The electronic package for high frequency semiconductor devices as recited in claim 29, wherein said plurality of circuit members is substantially parallel to one another.

51. The electronic package for high frequency semiconductor devices as recited in claim 50, further comprising an external printed circuit structure and wherein said plurality of circuit members is substantially parallel to said external printed circuit structure.

52. The electronic package for high frequency semiconductor devices as recited in claim 29, further comprising thermal management structures.

53. The electronic package for high frequency semiconductor devices as recited in claim 52, wherein said thermal management structures comprise heat-conductive fins in thermal contact with said at least one semiconductor device.

54. The electronic package for high frequency semiconductor devices as recited in claim 29, wherein said external data bus comprises at least two external data buses; said extension of said external data bus comprises at least two extensions of said two data buses; and said semiconductor device comprises two groups of at least one semiconductor device, each group being independently connected to one of said two data bus extensions.

\* \* \* \* \*